US006419806B1

(12) United States Patent
Holcomb et al.

(10) Patent No.: US 6,419,806 B1
(45) Date of Patent: Jul. 16, 2002

(54) INSERT TARGET ASSEMBLY AND METHOD OF MAKING SAME

(75) Inventors: Melvin K. Holcomb, Grove City; William E. Barnes, Circleville; Steven L. Bardus, Westerville, all of OH (US)

(73) Assignee: Tosoh SMD, Inc., Grove City, OH (US)

( * ) Notice: Subject to any disclaimer, the term of this patent is extended or adjusted under 35 U.S.C. 154(b) by 0 days.

(21) Appl. No.: 09/807,261

(22) PCT Filed: Dec. 3, 1999

(86) PCT No.: PCT/US99/28723

§ 371 (c)(1),
(2), (4) Date: Apr. 9, 2001

(87) PCT Pub. No.: WO00/32347

PCT Pub. Date: Jun. 8, 2000

Related U.S. Application Data (60) Provisional application No. 60/110,765, filed on Dec. 3, 1998.

(51) Int. Cl.[7] ............................ B23K 20/00; C23C 14/34
(52) U.S. Cl. ............................ 204/298.12; 204/298.13; 428/636; 428/637; 428/638; 428/650; 428/652; 428/655; 428/658; 428/686; 419/49; 228/141.1; 228/155; 228/190; 228/193; 228/195; 228/199; 228/227; 228/228
(58) Field of Search ...................... 204/298.12, 298.13; 428/636, 637, 638, 650, 652, 655, 658, 686; 419/49; 228/141.1, 155, 190, 193, 195, 199, 227, 228

(56) References Cited

U.S. PATENT DOCUMENTS

| 3,912,152 A | 10/1975 | Forand, Jr. |
| 4,135,286 A | 1/1979 | Wright et al. |
| 4,202,709 A | 5/1980 | Shibamori et al. |
| 4,869,468 A | 9/1989 | Johnson |
| 4,873,419 A | 10/1989 | Acheson |
| 4,966,677 A | 10/1990 | Aichert et al. ......... 204/298.21 |
| 5,032,246 A | 7/1991 | Blazic et al. .......... 204/298.12 |
| 5,143,590 A | 9/1992 | Strothers et al. |
| 5,230,459 A | 7/1993 | Mueller et al. ............. 228/164 |
| 5,234,487 A | 8/1993 | Wickersham, Jr. et al. ... 75/248 |
| 5,317,006 A | 5/1994 | Kumar .................. 204/298.12 |

(List continued on next page.)

FOREIGN PATENT DOCUMENTS

| EP | 1074639 | 2/2001 |
| JP | 63-72874 | 4/1988 |
| JP | 4-350161 | 12/1992 |
| WO | 9508438 | 3/1995 |

*Primary Examiner*—Alan Diamond
(74) *Attorney, Agent, or Firm*—Biebel & French

(57) ABSTRACT

Method of forming a two-piece hollow cathode sputter target assembly and the assembly formed thereby. The sputter target assembly includes an outer shell having a substantially cylindrical side wall and is composed of a relatively low purity metallic material. A sputtering insert includes a substantially cylindrical side wall and is concentrically received within, and bonded to, the outer shell. The sputtering insert is composed of a relatively high purity metallic material as used for depositing a thin layer or film onto a desired substrate.

20 Claims, 6 Drawing Sheets

U.S. PATENT DOCUMENTS

| | | | |
|---|---|---|---|
| 5,482,611 A | 1/1996 | Helmer et al. | 204/298.17 |
| 5,687,600 A | 11/1997 | Emigh et al. | 72/69 |
| 5,716,505 A * | 2/1998 | Scherer | 204/289.11 |
| 5,728,280 A * | 3/1998 | Scherer | 204/298.18 |
| 5,729,084 A | 3/1998 | Hale et al. | |
| 5,783,795 A * | 7/1998 | Gilman et al. | 219/121.45 |
| 5,858,556 A | 1/1999 | Eckert et al. | |
| 5,883,361 A * | 3/1999 | Kellogg et al. | 219/390 |
| 5,982,973 A | 11/1999 | Yan et al. | |
| 5,985,115 A | 11/1999 | Hartsough et al. | 204/298.09 |
| 6,030,514 A | 2/2000 | Dunlop et al. | |
| 6,085,966 A * | 7/2000 | Shimomuki et al. | 228/193 |
| 6,164,519 A | 12/2000 | Gilman et al. | 228/107 |
| 6,193,854 B1 * | 2/2001 | Lai et al. | 204/192.12 |
| 6,277,249 B1 * | 8/2001 | Gopalraja et al. | 204/192.12 |
| 6,283,357 B1 * | 9/2001 | Kulkarni et al. | 228/155 |

\* cited by examiner

INSERT TARGET ASSEMBLY AND METHOD OF MAKING SAME

CROSS-REFERENCE TO RELATED APPLICATIONS

This application is a 371 PCT/US88/28723 filed Dec. 3, 1999, and published under PCT 21(2) in the English language which claims the benefit of U.S. provisional application Serial No. 60/110,765 filed Dec. 3, 1998.

BACKGROUND OF THE INVENTION

1. Field of the Invention

The present invention relates to methods for preparing sputter target assemblies, and to the sputter target assemblies prepared by these methods. In particular, the invention relates to pot-shaped, or hollow cathode, sputter target assemblies, and methods for making such assemblies.

2. Description of the Prior Art

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits to form the thin layer or film on the receiving surface of the substrate.

The sputter target is heated during the sputtering process by the thermal energy of the bombarding gas ions. In conventional cathode target assemblies, the target is attached to a nonmagnetic backing plate. The backing plate is typically water-cooled to carry away the heat generated by the ion bombardment of the target.

One type of knows system for coating substrates by cathodic sputtering includes a cathode having a hollow body with an open end facing the substrate and anode. A series of magnets may be provided around the hollow cathode body for optimizing the ionization through magnetic fields. As such, coating coverage and uniformity on the substrate is improved. Examples of such hollow cathode assemblies are illustrated in U.S. Pat. No. 5,985,115 to Hartsough et al. U.S. Pat. No. 4,966,677 to Aichert et al. and U.S. Pat. No. 5,728,280 to Scherer, both of which are incorporated herein by reference.

High purity metal and metal alloys having a purity level greater than that available from commercial grade materials and typically selected form the group including titanium, copper, tantalum, cobalt, tungsten and aluminum, are utilized as the sputtering material in conventional target cathode assemblies. As may be appreciated, such high purity metals and metal alloys are often not readily available and are costly to obtain. Additionally, typical target cathode assembly sputtering materials have relatively high specific gravities resulting in difficulty in their manipulation due to excessive weight.

The above described traditional hollow cathode target assemblies are monolithic in design such that the assembly is formed entirely of the costly and often relatively heavy high purity metals and metal alloys. Additionally, such hollow cathode target assemblies are generally inefficient in that a significant portion of the sputtering material remains unused when the assembly requires replacement.

Accordingly, there remains a need for a hollow cathode target assembly which increases the efficient use of the expensive high-purity sputtering material and generally reduces the assembly's overall weight. Additionally. there is a need for a method of producing such a hollow cathode target assembly.

SUMMARY OF THE INVENTION

The present invention provides a two-piece pot-shaped, or hollow cathode, sputter target assembly including a sputtering insert of high purity sputtering material which is concentrically received with an outer shell of less expensive, lower purity and preferably, lighter weight material.

More particularly, the invention contemplates a sputter target assembly comprising a sputtering insert including a substantially cylindrical side wall defining a longitudinal axis and having inner and outer surfaces. One end of the 30 sputtering insert is closed by a substantially planar end wall connected to the side wall and having an inner surface connected to the inner surface of the side wall The opposing end of the sputtering insert is open such that the inner surfaces of the side wall and end wall define a cup-shaped sputtering surface.

The sputtering insert is concentrically received within an outer shell. The outer shell includes a substantially cylindrical side wall having inner and outer surfaces. A substantially planar end wall is connected to the side wall at one end of the outer shell and includes an inner surface. The inner surfaces of the side wall and end wall of the outer shell are adapted to mate with the outer surfaces of the side wall and end wall of the sputtering insert along an interfacial area located between the sputtering insert and the outer shell. The interfacial area includes a substantially cylindrical portion extending coaxial to the longitudinal axis.

The sputtering insert is preferably composed of a first metallic material selected from the group consisting of high purity titanium, copper, tantalum, cobalt, tungsten, aluminum and alloys thereof. The outer shell is preferably composed of a second metallic material selected from the group consisting of low purity aluminum, copper, steel, titanium and alloys thereof. The first metallic material has a purity significantly greater than that of a respective second metallic material.

One embodiment of the method of the present invention for forming the above-described two-piece hollow cathode sputter target assembly includes the steps of forming a blank of a first metallic material into a sputtering insert including a substantially cylindrical side wall and an end wall, the side wall and the end wall defining an outer mating surface and an inner sputtering surface. A blank of a second metallic material is formed into an outer shell including a substantially cylindrical side wall and an end wall, the side wall and end wall defining an inner mating surface.

The sputtering insert is positioned concentrically within the outer shell and a substantially cylindrical plug is next positioned concentrically within the sputtering insert. The sputtering insert and plug are then placed within a hot isostatic press can. A closure plate is then secured to the can to form a vacuum tight can assembly wherein residual air is evacuated from the can assembly. The can assembly is then subjected to a predetermined temperature at a predetermined pressure for a predetermined period of time, thereby diffusion bonding the sputtering insert to the outer shell.

A first alternative embodiment of the method of the present invention includes the steps of forming the outer shell and sputtering insert as detailed above but in a manner providing for an interference fit at room temperature. More particularly, the inner diameter of the side wall of the outer shell is selected to be less than the outer diameter of the sputtering insert at ambient room temperature. The sputtering insert is preferably provided at a first predetermined temperature no greater than ambient room temperature and the outer shell is heated to a second predetermined temperature above ambient room temperature. Next, the sputtering insert is slidably received within the outer shell. The sputtering insert is then heated, if necessary, and the outer shell cooled, to ambient room temperature wherein the outer shell contracts, thereby providing an interference fit between the side walls of the sputtering insert and the outer shell at room temperature.

In a second alternative embodiment of the method of the present invention, a substantially planar sputtering blank composed of a first metallic material having a first mating surface is provided. Likewise, a substantially planar shell blank composed of a second metallic material having a second mating surface is provided. The shell blank is bonded with the sputtering blank to form a blank assembly.

Bonding is preferably accomplished by pressing the first mating surface together with the second mating surface at a predetermined temperature below melting points of the first and second metallic materials such that a diffusion bond is formed along the first and second mating surfaces to define a blank assembly. The blank assembly is next formed using traditional metal working methods into a cup-shaped sputter target assembly including an outer shell composed of the shell blank and a sputtering insert composed of the sputtering blank wherein the sputtering insert is concentrically disposed within the outer shell. The sputter target assembly includes an outer cylindrical wall defined by the outer shell and an inner cylindrical wall defined by the sputtering insert wherein the inner cylindrical wall is bonded to the outer cylindrical wall.

Therefore, it is an object of the present invention to provide a hollow cathode target assembly which increases material efficiency by reducing the amount of expensive sputtering material which is not fully processed.

It is a further object of the present invention to provide a hollow cathode target assembly of a reduced weight, thereby facilitating manipulation thereof.

It is another object of the present invention to provide a hollow cathode target assembly which is inexpensive.

It is yet another object of the present invention to provide a method of forming such a hollow cathode target assembly by providing a relatively inexpensive outer shell which concentrically receives a high purity sputtering insert.

It is a further object of the present invention to provide such a method of forming a hollow cathode target assembly which provides adequate bonding strength.

Other objects and advantages of the invention will be apparent from the following description, the accompanying drawings and the appended claims.

DETAILED DESCRIPTION OF THE PREFERRED EMBODIMENT

Figure 1:
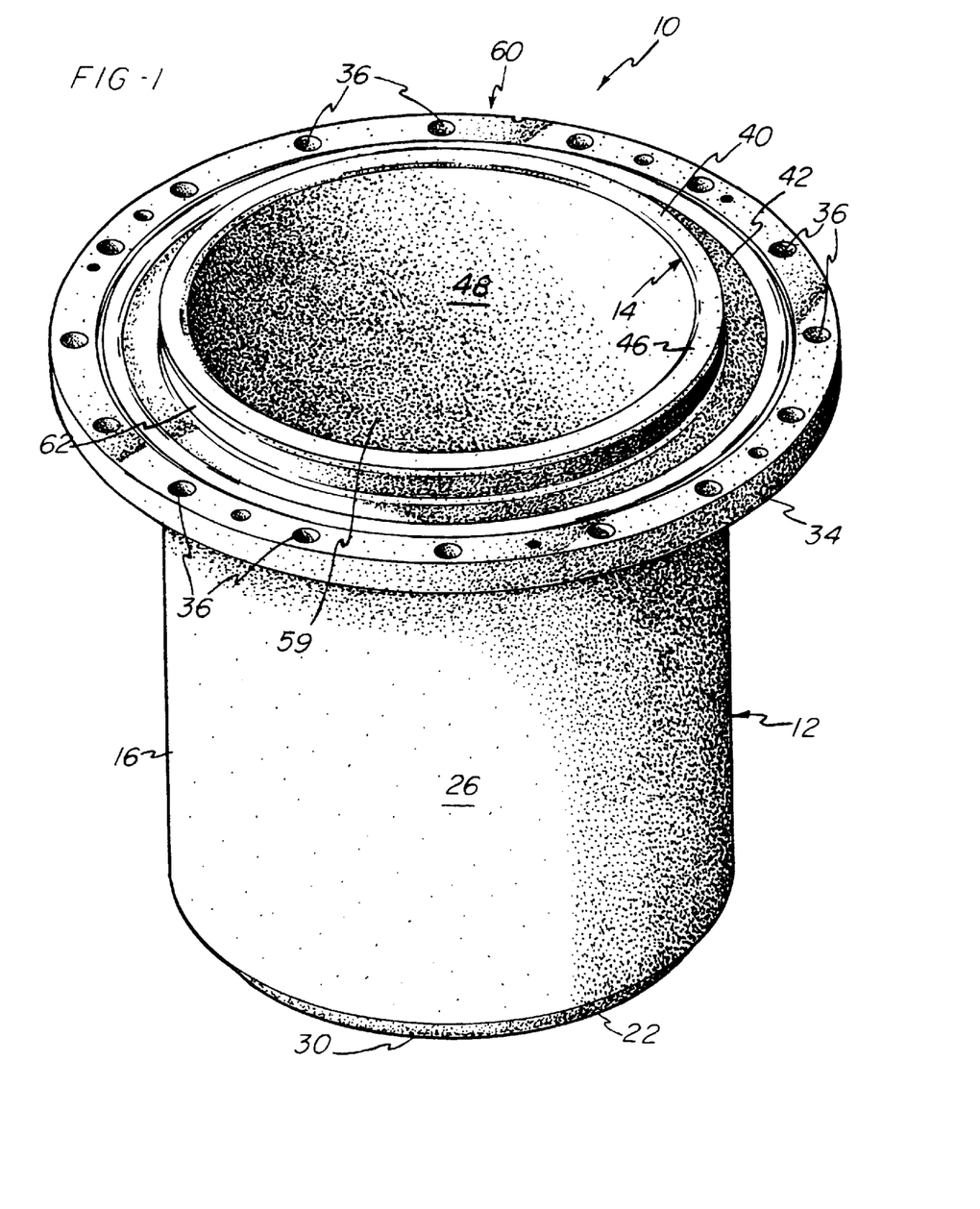
FIG. 1 is a perspective view of the sputtering target assembly made in accordance with the present invention.
Figure 2:
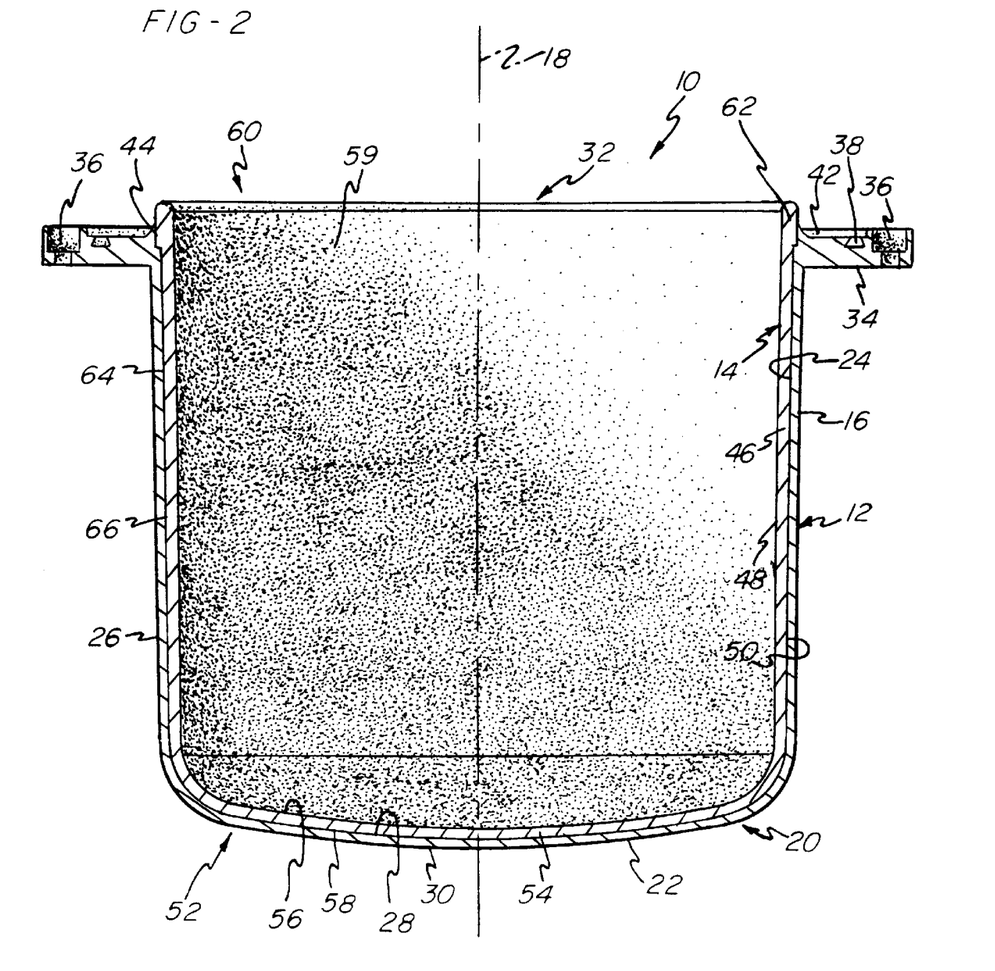
FIG. 2 is a cross-sectional view of the sputtering target assembly of FIG. 1.
Figure 3:
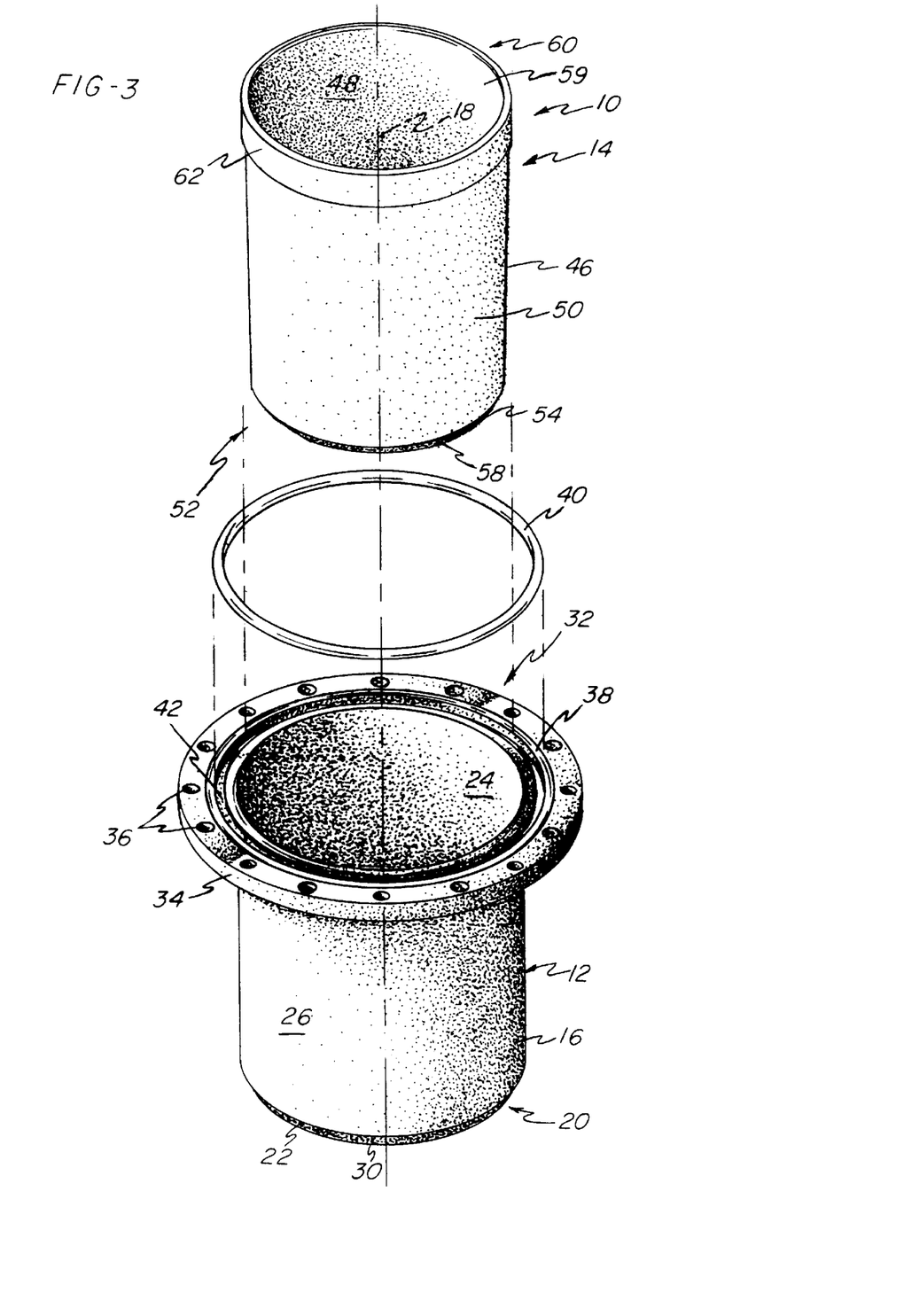
FIG. 3 is an exploded perspective view of the sputtering target assembly of FIG. 1.

Referring initially to FIGS. 1–3. the sputter target assembly 10 of the present invention includes an outer shell 12 which is bonded to a sputtering insert 14. The sputtering insert 14 is preferably composed of a first metallic material selected from the group consisting of high purity titanium, copper, tantalum, cobalt, tungsten, aluminum and alloys thereof. This group of first metallic materials have relatively high purity as defined to be greater than that available from commercial grade materials. The particular material utilized for the sputtering insert 14 may be selected from this group based upon a variety of criteria including, but not limited to, etching ability, ease of manufacture, and resistivity. The outer shell 12 is preferably composed of a second metallic material which is selected from the group consisting of relatively low purity aluminum, copper, steel, titanium and alloys thereof. The second metallic material is generally commercial grade and has a purity significantly lower than that of the first metallic material.

The outer shell 12 is cup-shaped and includes a substantially cylindrical side wall 16 defining a longitudinal center axis 18. A first end 20 of the outer shell 12 is closed by a substantially planar end wall 22 connected to the side wall 16 and extending substantially transversely to the longitudinal axis 18. The side wall 16 includes an inner or fast mating surface 24 and an outer surface 26. Likewise, the end wall 22 includes an includes or first mating surface 28 and an outer surface 30. A second end 32 of the outer shell 12 remains open to define an open chamber 33.

The side wall 16 proximate the open second end 32 supports a mounting element comprising an annular flange 34 extending radially outwardly from the side wall 16. A plurality of mounting bores 36 are circumferentially equally spaced around the mounting flange 34. An annular groove 38 extends within the mounting flange 34 from proximate the open second end 32 towards the closed first end 20. A sealing member, preferably an O-ring 40 is received within the annular groove 38 for providing a seal between the outer shell 12 and a wall (not shown) of the sputtering system.

An annular recess 42 is likewise formed within the mounting flange 34 and is in communication with the annular groove 38. The annular recess 42 is adapted to receive an insulating member (not shown) for providing insulation between the outer shell 12 and the wall of the sputtering system. The side wall 16 includes a receiving notch 44 proximate the second open end 32 and extending radially outwardly from the longitudinal axis 18.

The sputtering insert 14 is cup-shaped and concentrically received within the outer shell 12. The sputtering insert 14 comprises a substantially cylindrical side wall 46 having an inner surface 48 and an outer or second mating surface 50. A first end 52 of the sputtering insert 14 is closed by a substantially planar end wall 54 connected to the side wall 46 and extending substantially transverse to the longitudinal axis 18. The end wall 54 includes an inner surface 56 and an outer or second mating surface 58. The inner surfaces 48 and 56 of the side wall 46 and end wall 54 form a sputtering surface which defines an open chamber 59. The side wall 46 proximate an open end 60 of the sputtering insert 14 includes a radially outwardly extending lip 62 for engaging the receiving notch 44 of the outer shell 12. As may be appreciated, the lip 62 provides an extremity for the sputter target assembly 10 consisting solely of the high purity first metallic material of the sputtering insert 14.

The inner or first mating surfaces 24 and 28 of the outer shell 12 are adapted to mate with the inner or second mating surfaces 48 and 56 of the sputtering insert 14 along an interfacial area 64 between the sputtering insert 14 and the outer shell 12. The interfacial area 64 includes a substantially cylindrical portion 66 extending coaxially with the longitudinal axis 18 (FIG. 2).

Figure 4:
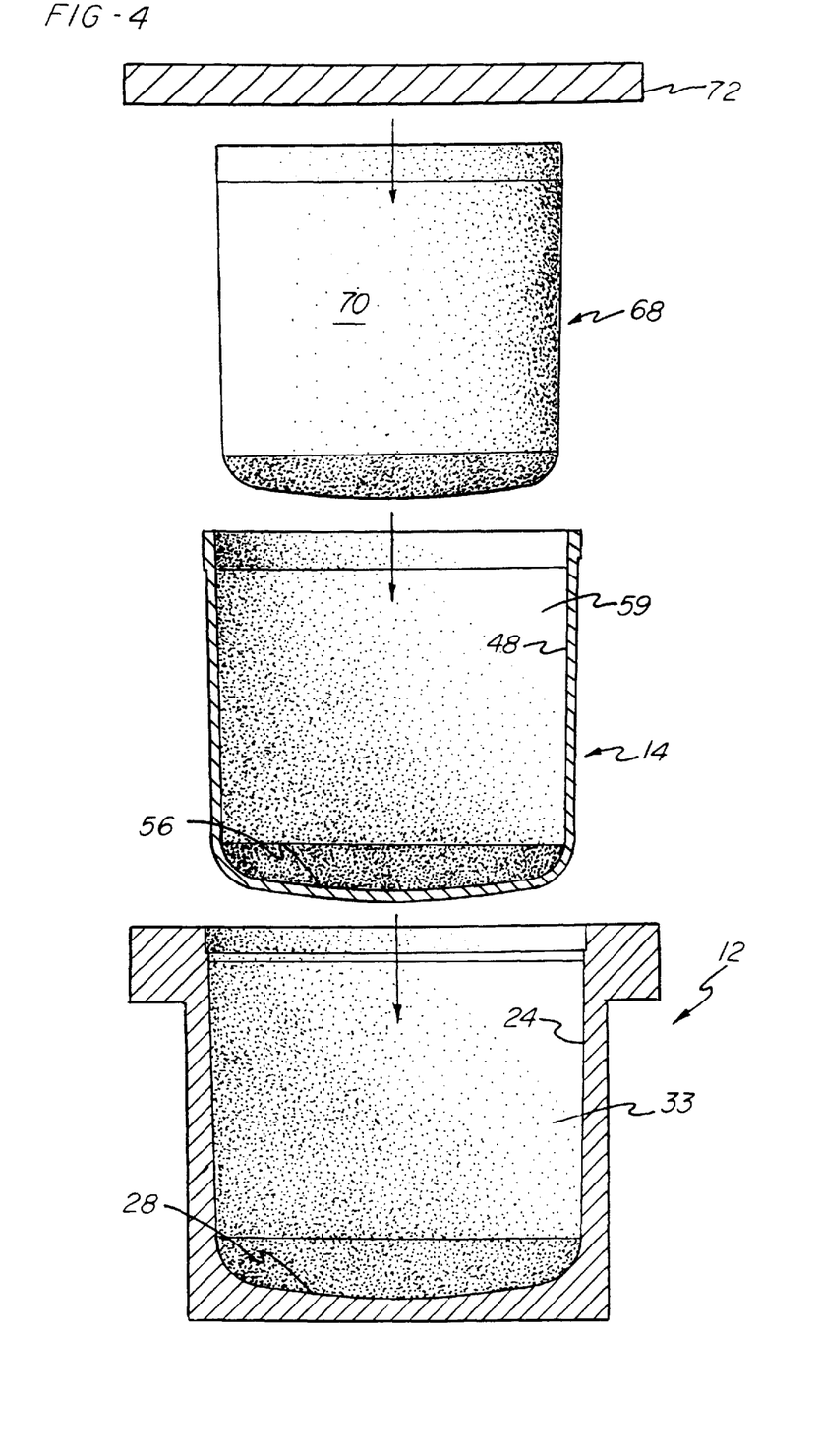
FIG. 4 is a diagrammatical view illustrating a series of steps performed in accordance with a first preferred method of the present invention.
Figure 5:
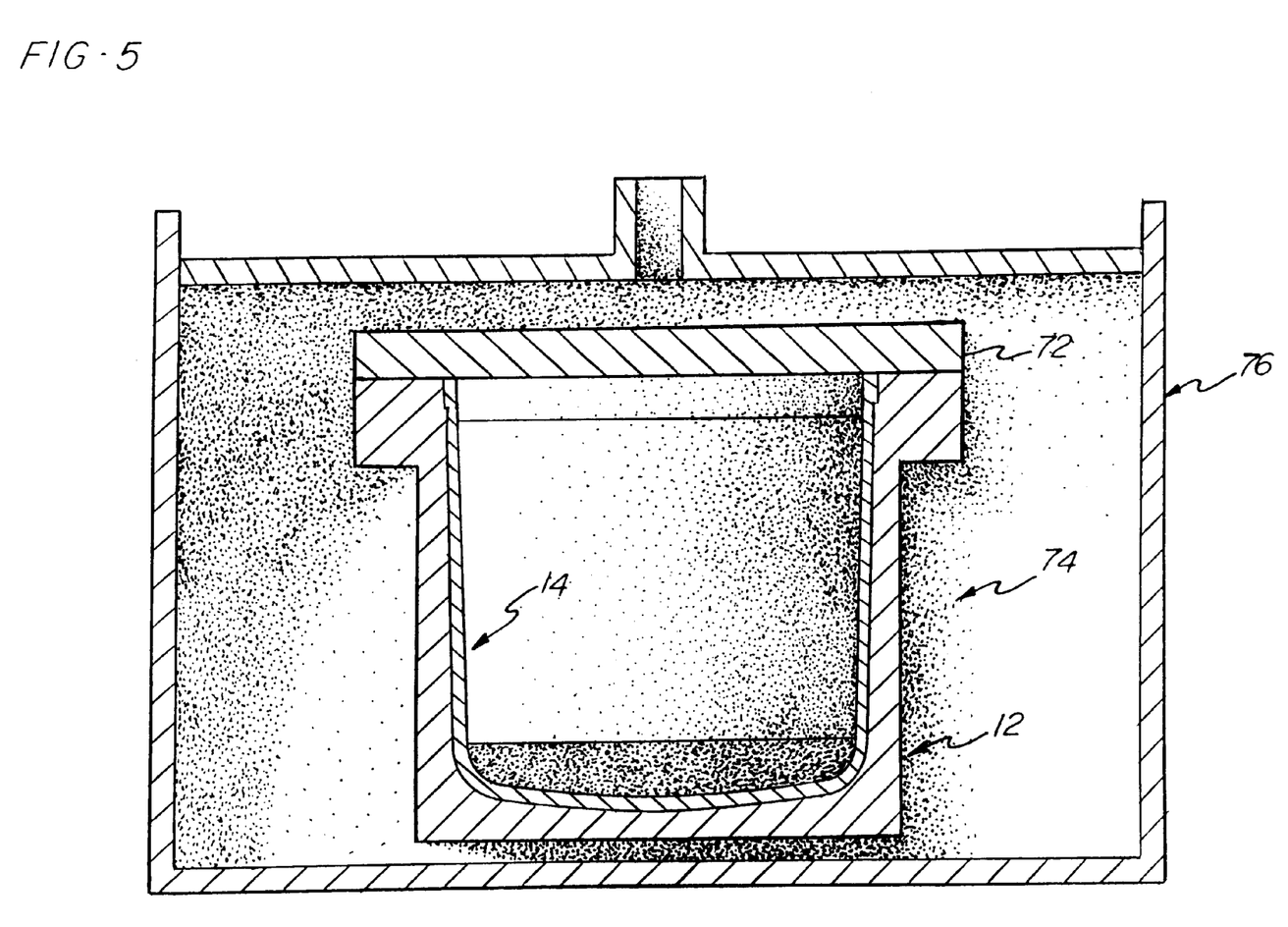
FIG. 5 is a diagrammatical view of a hot isostatic press can placed within a hot isostatic pressure chamber.

Turning now to FIGS. 4 and 5. a first preferred embodiment of forming the sputter target assembly 10 of the present invention is illustrated. Initially. the sputtering insert 14 is formed from a blank of the first metallic material through traditional metal working methods. Likewise, a blank of the second metallic material is formed into the outer shell 12 by traditional metal working techniques. These traditional metal working techniques preferably comprise a spinning or deep drawing operation. Once the outer shell 12 and sputtering insert 14 are thus formed, they may be machined to appropriate dimensions as required. It should be noted that through experimentation it has been discovered that the final bonded target assembly 10 may shrink during diffusion bonding such that dimensions of the sputtering insert 14 should be adjusted accordingly to allow for such shrinkage.

Next, a substantially cylindrical solid plug 68 is inserted within the sputtering insert 14. The plug 68 is utilized to prevent the outer shell 12 and sputtering insert 14 from deforming or collapsing during subsequent bonding operations. The plug 68 is preferably composed of aluminum, steel or graphite, wherein aluminum is the preferred material due to its thermal properties, ease of machining and expense. Further, the plug 68 is preferably coated with boron nitride to facilitate its removal following subsequent bonding operations. A 0.005 inch gap is preferably provided between the side walls 16 and 46 of the outer shell 12 and the sputtering insert 14. Likewise, a 0.005 inch gap is preferably provided between the side wall 46 of the sputtering insert 14 and the outer surface 70 of the plug 68.

After the outer shell 12, sputtering insert 14 and plug 68 are all concentrically disposed, a top closure plate 72 is welded to the outer shell 12 to form a can assembly 74 defining a vacuum tight closure, as shown in FIG. 5. The closure plate 72 is preferably welded to the outer shell 12 through electron beam welding in a vacuum atmosphere. This process of electron beam welding in vacuum is well known in the art and there are numerous electron beam welders available on the market which may be utilized for this purpose.

Next, the can assembly 74 is placed within a hot isostatic press (HIP) chamber 76 and is subjected to an HIP process at a predetermined temperature and pressure for a selected time. The can assembly 74 is typically subjected to equal pressure from all sides by means of a pressurizing gas, usually argon. The particular conditions used for the HIP process are selected to meet the requirements necessary to achieve sound bonds between the outer shell 12 and sputtering insert 14.

In a preferred HIP process, the sputtering insert 14 comprises tantalum and the low purity outer shell 12 comprises aluminum. The can assembly 74 may be subjected to a temperature of approximately 565° C. within a range of ±4° C. at a pressure between 10.17 Mega Pascals (MPa) and 10.35 MPa. It is preferred that these parameters be maintained for ±3 hours 0.1 hours. Hot isostatic pressing methods are described in more detail in U.S. Pat. No. 5,234,487, to Wickersham et al. and U.S. Pat. No. 5,230,459, to Mueller et al., the disclosures of which are incorporated herein by reference.

After the HIP process is completed, the closure plate 72 is machined off and the plug 68 removed from within the sputtering insert 14. The assembly may then be machined, if desired, by conventional means to predetermined dimensions for the final sputter target assembly 10.

A second preferred method of bonding the sputtering insert 14 within the outer shell 12 comprises a shrink fit bonding method wherein an interference is provided between the side walls 16 and 46 of the outer shell 12 and sputtering insert 14 at room temperature. More particularly, the steps for providing the shrink fit bond include providing the sputtering insert 14 at a first predetermined temperature no greater than ambient room temperature. The sputtering insert 14 may be cooled to a temperature below ambient room temperature. The outer shell 12 is heated to a second predetermined temperature above ambient room temperature. The sputtering insert 14 at the first temperature is then concentrically placed within the outer shell 12 at the second elevated temperature. Next, the sputtering insert 14 and the outer shell 12 are returned to ambient room temperature by heating and cooling, as required. The outer shell 12 contracts thereby providing an interference fit between the side walls 16 and 46 of the outer shell 12 and the sputtering insert 14 at room temperature. If the sputtering insert 14 is heated from a first temperature below ambient room temperature, it will expand thereby providing additional interference between the side walls 16 and 46.

In a preferred shrink fit method of bonding, the sputtering insert 14 comprises tantalum and the outer shell 12 comprises low purity aluminum. The sputtering insert 14 and outer shell 12 are formed to define an approximate 0.060 inch interference between the outer diameter of the side wall 46 and the inner diameter of the side wall 16 at ambient room temperature. The sputtering insert 14 remains at ambient room temperature of approximately 24° C., while the outer shell 12 is simultaneously heated to approximately 482° C. for about 1 hour. The sputtering insert 14 is then slidably received within the heated outer shell 12. The assembly is then air cooled to ambient room temperature.

Figure 6:
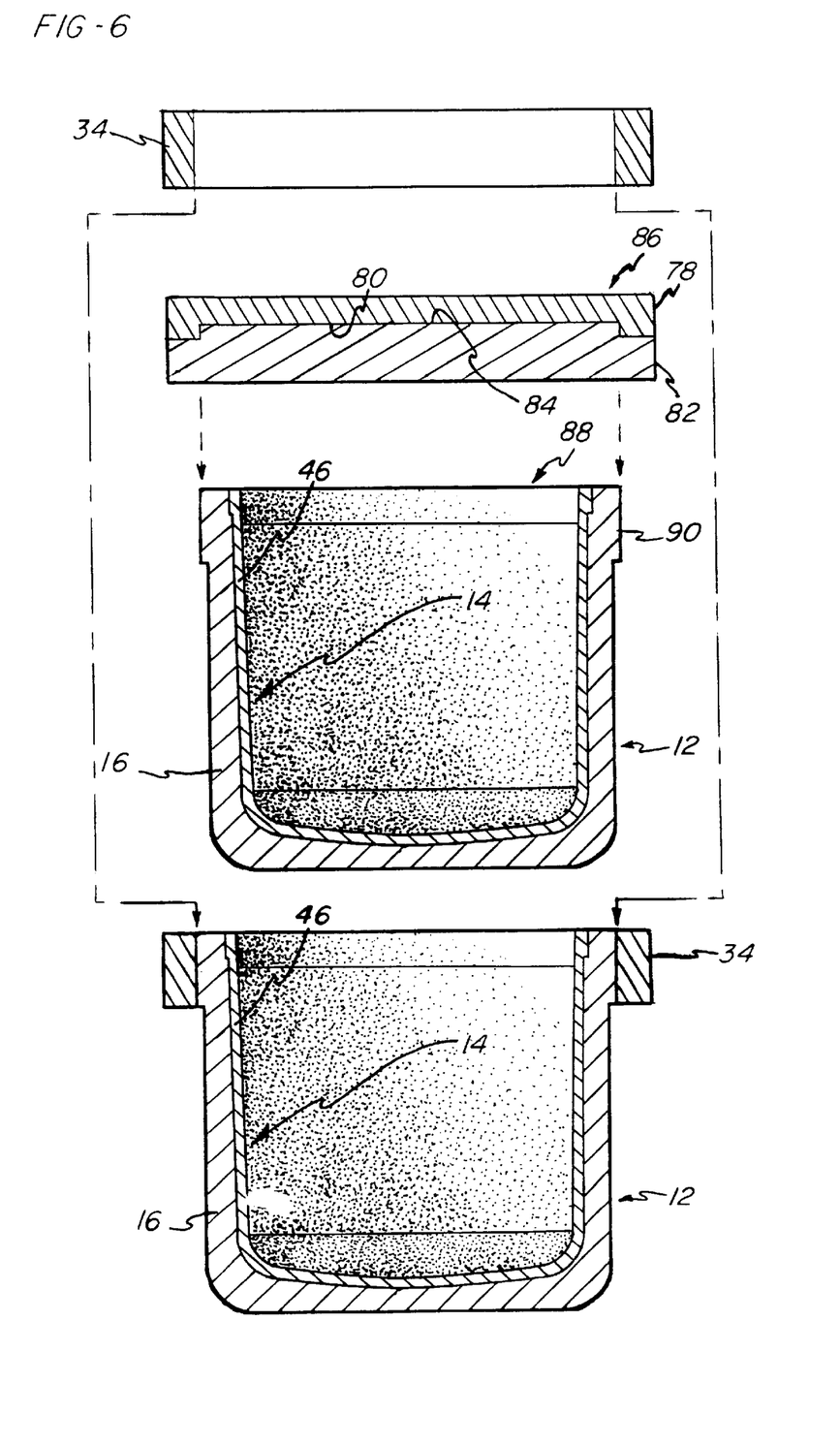
FIG. 6 is a diagrammatical view illustrating a series of steps performed in accordance with a second preferred method of the present invention.

Referring now to FIG. 6, a third preferred embodiment of the method of the present invention comprises providing a substantially planar sputtering blank 78 composed of the first metallic material having a first mating surface 80 and providing a substantially planar shell blank 82 composed of the second metallic material having a second mating surface 84. The planar shell blank 82 and planar sputtering blank 78 are bonded together to form a blank assembly 86.

In a diffusion bonding method, the first and second mating surfaces 80 and 84 are pressed together at a predetermined temperature below the melting points of the first and second metallic materials such that a diffusion bond is formed along the first and second mating surfaces 80 and 84. This conventional diffusion bonding method is well known in the art.

In a weld bonding method, a weld is formed along the edge of the shell blank 82 and sputtering blank 78 under vacuum conditions. The weld seals a vacuum between the first and second mating surfaces 80 and 84 thereby bonding the blanks 78 and 82 together. It is important that the first and second metallic materials be weld compatible, i.e., exhibit similar material properties. As such, it is believed that a preferred combination comprises a first metallic material of high purity copper (about 5–6 N purity) bonded to a second metallic material of low purity copper (about 4 N purity).

The blank assembly 86 so bonded is then formed using conventional metal working techniques into the pot-shaped formed blank assembly 88. The working technique may comprise spinning and/or deep drawing. The sputtering insert 14 is thus concentrically disposed within the outer shell 12 such that the formed blank assembly 88 includes an outer cylindrical wall 16 defined by the outer shell 12 and an inner cylindrical wall 46 defined by the sputtering insert 14 wherein the inner and outer walls 46 and 16 are bonded together.

Next, a ring defining the mounting flange 34 is concentrically disposed over the outer shell 12. The mounting flange 34 is then welded in place to a projecting portion 90 of the side wall 16.

In this alternative embodiment of the method of the present invention, it is preferred that the first metallic material and the second metallic material possess similar metal forming, particularly work hardening, properties to help maintain the bond between the shell blank 82 and sputtering blank 78 during the forming operation.

While the methods herein described and the products produced by these methods constitute preferred embodiments of this invention, it is to be understood that the invention is not limited to these precise methods and products, and that changes may be made in either without departing from the scope of the invention which is defined in the appended claims.

What is claimed is:

1. A sputter target assembly comprising:
    a sputtering insert including a substantially cylindrical side wall connected to an end wall, said side and end walls having inner and outer surfaces;
    an outer shell including a substantially cylindrical side wall connected to an end wall, said side and end walls having inner and outer surfaces; and
    wherein said sputtering insert is concentrically received within said outer shell and said inner surfaces of said outer shell are bonded to said outer surfaces of said sputtering insert thereby forming a substantially pot-shaped sputter target.

2. The sputter target assembly of claim 1 wherein said sputtering insert is composed of a first metallic material selected from the group consisting of titanium, copper, tantalum, cobalt, tungsten, aluminum and alloys thereof.

3. The sputter target assembly of claim 1 wherein said outer shell is composed of a second metallic material selected from the group consisting of aluminum, copper, steel, titanium and alloys thereof.

4. The sputter target assembly of claim 1 wherein said outer shell and said sputtering insert are diffusion bonded together by hot isostatically pressing said outer shell together with said sputtering insert at a temperature and at a pressure for a period of time.

5. The sputter target assembly of claim 1 wherein said outer shell and said sputtering insert are bonded together by an interference fit between said outer and inner cylindrical side walls, said interference fit formed at room temperature.

6. A sputter target assembly comprising:
    a sputtering insert composed of a first metallic material, said sputtering insert including a substantially cylindrical side wall defining a longitudinal axis and connected to an end wall, said side and end walls having inner and outer surfaces, said inner surfaces defining a sputtering surface; and
    an outer shell composed of a second metallic material, said outer shell including a substantially cylindrical side wall connected to an end wall, said side and end walls having inner and outer surfaces, said inner surfaces of said outer shell adapted to mate with said outer surfaces of said sputtering insert along an interfacial area therebetween to form a substantially pot-shaped sputter target, said interfacial area having a substantially cylindrical portion extending coaxial to said longitudinal axis.

7. The sputter target assembly of claim 6 wherein said first metallic material is selected from the group consisting of titanium, copper, tantalum, cobalt, tungsten, aluminum and alloys thereof.

8. The sputter target assembly of claim 6 wherein said second metallic material is selected from the group consisting of aluminum, copper, steel, titanium and alloys thereof.

9. The sputter target assembly of claim 6 wherein said outer shell and said sputtering insert are diffusion bonded together by hot isostatically pressing said outer shell together with said sputtering insert at a temperature and at a pressure for a period of time.

10. The sputter target assembly of claim 6 wherein said sputtering insert is concentrically received within said outer shell.

11. A method of forming a sputter target assembly used for forming a film on a substrate, said method comprising the steps of:
    forming a blank of first metallic material into a sputtering insert including a substantially cylindrical side wall connected to an end wall, said side and end walls having outer mating and inner sputtering surfaces;
    forming a blank of second metallic material into an outer shell including a substantially cylindrical side wall connected to an end wall, said side and end walls having inner mating surfaces;
    placing said sputtering insert concentrically within said outer shell; and
    bonding said inner mating surfaces of said outer shell to said outer mating surfaces of said sputtering insert thereby forming a substantially pot-shaped sputter target.

12. The method as recited in claim 11 wherein said step of bonding includes pressing said outer shell and said sputtering insert together along said inner and outer mating surfaces at a temperature below the melting points of said first and second metallic materials such that a diffusion bond is formed along said inner and outer mating surfaces.

13. The method as recited in claim 11 wherein said step of bonding includes:
    providing said sputtering insert at a first temperature;
    heating said outer shell to a second temperature prior to said step of placing said sputtering insert within said outer shell; and
    returning said sputtering insert and said outer shell to room temperature after said step of placing said sputtering insert within said outer shell, thereby providing an interference fit between said side walls of said sputtering insert and said outer shell at room temperature.

14. A method of forming a sputter target assembly comprising:

provide a sputtering insert including a substantially cylindrical side wall and an end wall, said side wall having an outer mating surface and an inner sputtering surface, said sputtering insert composed of a first metallic material;

providing an outer shell including a substantially cylindrical side wall having an inner mating surface, said outer shell composed of a second metallic material;

placing said sputtering insert concentrically within said outer shell; and pressing said outer shell and said sputtering insert together along said inner and outer mating surfaces at a temperature below melting points of said first and second metallic materials such that a diffusion bond is formed along said inner and outer mating surfaces.

15. The method as recited in claim 14 wherein said step of pressing includes the steps of:

placing a plug concentrically within said sputtering insert;

placing said sputtering insert and plug within a hot isostatic press can;

securing a closure plate to said can to form a vacuum tight can assembly;

evacuating residual air from said can assembly; and subjecting said can assembly to a temperature and a pressure for a period of time.

16. The method as recited in claim 15 wherein said temperature is about 565° C., said pressure is about 10.17 MPa and said time is about 3 hours.

17. The method as recited in claim 14 wherein said first metallic material is selected from the group consisting of titanium, copper, tantalum, cobalt, tungsten, aluminum and alloys thereof.

18. The method as recited in claim 14 wherein said second metallic material is selected from the group consisting of aluminum, copper, steel, titanium and alloys thereof.

19. The method as recited in claim 15 wherein said plug is composed of a material selected from the group consisting of aluminum, steel, graphite and alloys thereof.

20. The method as recited in claim 15 wherein said outer shell forms said hot isostatic press can.

* * * * *